(12) United States Patent
Nakagawa et al.

(10) Patent No.: US 10,073,339 B2
(45) Date of Patent: Sep. 11, 2018

(54) IMPRINT APPARATUS

(71) Applicant: CANON KABUSHIKI KAISHA, Tokyo (JP)

(72) Inventors: Kazuki Nakagawa, Utsunomiya (JP); Yosuke Murakami, Utsunomiya (JP); Mitsuru Hiura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 611 days.

(21) Appl. No.: 14/565,520

(22) Filed: Dec. 10, 2014

(65) Prior Publication Data

US 2015/0190961 A1 Jul. 9, 2015

(30) Foreign Application Priority Data

Jan. 8, 2014 (JP) ................................ 2014-001956

(51) Int. Cl.
*G03F 7/00* (2006.01)
*B29C 59/02* (2006.01)

(52) U.S. Cl.
CPC ............ *G03F 7/0002* (2013.01); *B29C 59/02* (2013.01); *B29C 59/022* (2013.01); *B29C 2059/023* (2013.01)

(58) Field of Classification Search
CPC ......... B29C 2043/585; B29C 2059/023; G03F 7/0002
See application file for complete search history.

(56) References Cited

U.S. PATENT DOCUMENTS

| 5,669,303 A * | 9/1997 | Maracas ................. B05C 1/027 101/327 |
| 6,137,562 A * | 10/2000 | Masuyuki ............... G03F 7/707 355/53 |
| 6,696,220 B2 * | 2/2004 | Bailey ................. B29C 35/0888 101/473 |
| 6,900,881 B2 * | 5/2005 | Sreenivasan ........ B29C 35/0888 257/E21.024 |

(Continued)

FOREIGN PATENT DOCUMENTS

| JP | 2007137051 A | 6/2007 |
| JP | 2010080714 A | 4/2010 |
| JP | 2011029235 A | 2/2011 |

OTHER PUBLICATIONS

Gibson A.G., Kotsikos G., Bland J.H., Toll S. (Dec 1998) Squeeze flow. In: Collyer A.A., Clegg D.W. (eds) Rheological Measurement. Springer, Dordrecht (Year: 1998).*

(Continued)

*Primary Examiner* — Benjamin A Schiffman
(74) *Attorney, Agent, or Firm* — Rossi, Kimms & McDowell LLP

(57) ABSTRACT

The present invention provides an imprint apparatus which performs an imprint process of molding an imprint material on a substrate with a mold and forming a pattern on the substrate, the apparatus including a detector configured to detect a shearing force generated in at least one of the mold and the substrate in a case where a pattern of the mold and a region of the substrate are aligned with each other with the imprint material on the substrate and the mold being in contact with each other, and a controller configured to control the imprint process based on the detected shearing force.

14 Claims, 4 Drawing Sheets

(56) References Cited

U.S. PATENT DOCUMENTS

| | | | |
|---|---|---|---|
| 7,691,313 B2* | 4/2010 | Choi | B29C 43/003 |
| | | | 264/102 |
| 8,166,876 B2* | 5/2012 | Schneider | B41K 3/02 |
| | | | 101/287 |
| 2004/0036850 A1* | 2/2004 | Tsukamoto | G03F 7/707 |
| | | | 355/72 |
| 2011/0042348 A1 | 2/2011 | Seki et al. | |

OTHER PUBLICATIONS

Office Action issued in Japanese Application No. 2014-001956 dated Nov. 2, 2017.

English translation of the Office Action issued in Japanese Application No. 2014-001956 dated Nov. 2, 2017 which was previously cited in an IDS filed on Nov. 8, 2017.

* cited by examiner

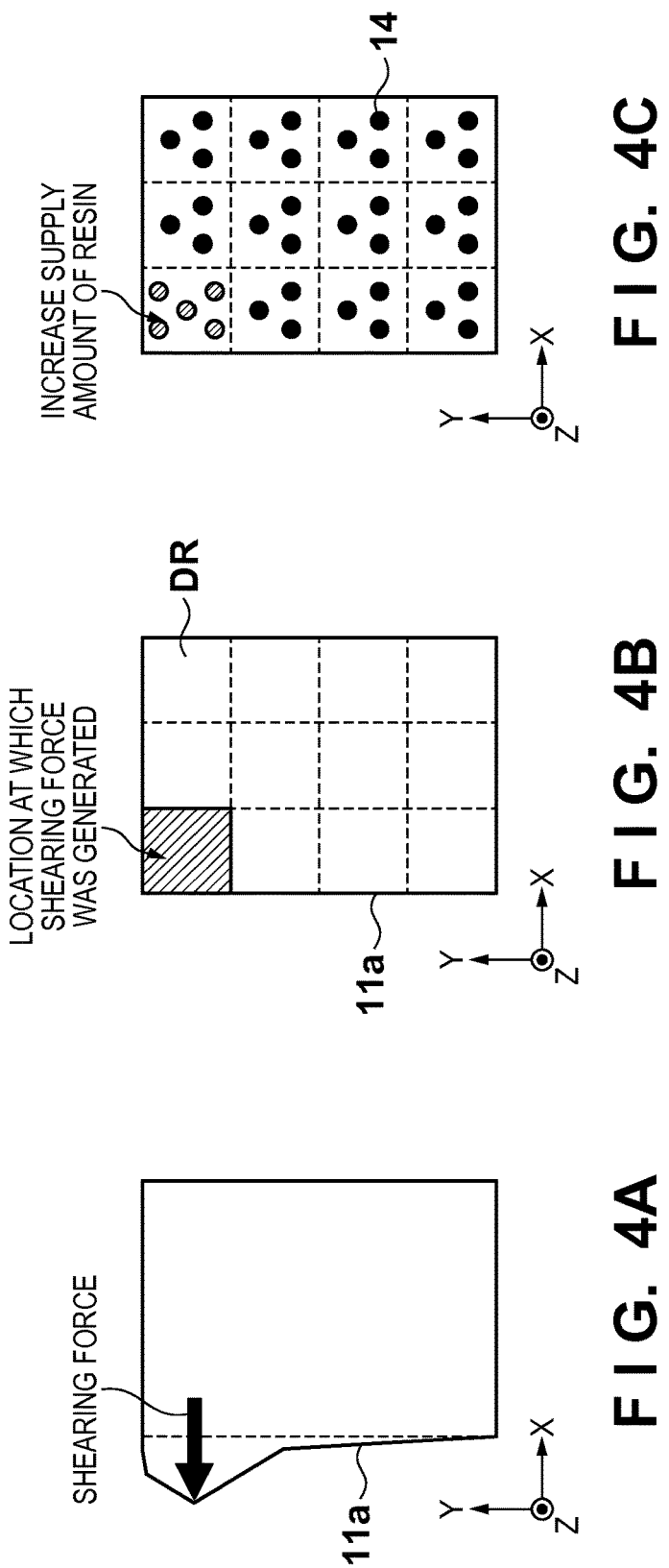

IMPRINT APPARATUS

BACKGROUND OF THE INVENTION

Field of the Invention

The present invention relates to an imprint apparatus, an imprint method, and a method of manufacturing an article.

Description of the Related Art

Demand for smaller semiconductor devices, MEMS, and the like has increased, and in addition to conventional photolithography techniques, microfabrication techniques according to which uncured resin on a substrate is molded using a mold so as to form a resin pattern on the substrate have been gaining attention. This technique is called an imprint technique, and it can be used to form microstructures (patterns) on the order of several nanometers on a substrate. Photocuring is one example of an imprint technique.

With an imprint apparatus that uses photocuring, first, photocurable resin (ultraviolet-curable resin) is supplied (applied) to a shot region (imprinting region) of a substrate and the resin (uncured resin) is molded using a mold. Then, light (ultraviolet ray) is emitted so as to cure the resin and the mold is removed from the cured resin on the substrate, and thereby a pattern of resin is formed on the substrate.

In a manufacturing step for a device, for example, since the substrate that is to be targeted to imprint process undergoes a heating process in a layer-forming step such as sputtering, there are cases where the entirety of the substrate expands or contracts and the shape (size) thereof changes in two axial directions that are perpendicular in a plane. Accordingly, with an imprint apparatus, when a mold is pressed onto the resin on the substrate, the shape of the pattern formed on the substrate (substrate side pattern) and the shape of a pattern formed on the mold (mold side pattern) need to be aligned. In the case of using an exposure apparatus, this kind of shape correction (magnification correction) can be dealt with by changing the demagnification of a projection optical system or the scanning velocity of a substrate stage according to the magnification of the substrate so as to change the image size. In contrast to this, an imprint apparatus includes a shape correction mechanism (magnification correction mechanism) that causes a mold to physically deform by applying an external force from a side surface of the mold or applying heat to the mold.

Herein, a case will be considered in which an imprint apparatus is applied in a step of manufacturing a semiconductor device with a half pitch of around 32 nm, for example. In this case, according to ITRS (International Technology Roadmap for Semiconductors), the overlay precision is 6.4 nm. Accordingly, in order to comply with this feature, shape correction also needs to be performed at a precision of several nanometers or less.

On the other hand, there is a possibility that deformation (distortion) will occur also in a mold used in the imprint apparatus. For example, during manufacturing, the pattern surface of the mold is oriented upward, and during use, the pattern surface of the mold is oriented downward. Accordingly, when using a mold, there is a possibility that the pattern surface (mold side pattern) will deform due to the influence of gravity, and the like. Also, since a mold pattern is generally formed by a drawing apparatus using a charged particle beam (electron beam, etc.), there is a possibility that a distortion will be generated in the pattern due to a distortion or the like of the optical system of the drawing apparatus.

Japanese Patent Laid-Open No. 2010-080714 proposes a technique for improving the overlay precision by aligning the shape of the substrate side pattern and the shape of the mold side pattern. With the technique disclosed in Japanese Patent Laid-Open No. 2010-080714, the substrate side pattern and the mold side pattern are aligned by causing the mold to deform using a mold chuck that holds the mold. Also, Japanese Patent Laid-Open No. 2007-137051 proposes a technique for aligning the mold and the substrate. With the technique disclosed in Japanese Patent Laid-Open No. 2007-137051, when the mold and the substrate are to be aligned while the mold and the resin on the substrate are in contact, the pressure applied by the mold on the resin is reduced, thereby facilitating adjustment of the positional relationship between the mold and the substrate.

With an imprint apparatus, accompanying a reduction in the size of the pattern formed on the substrate, the thickness of the resin (residual layer) during imprint process needs to be made thin for an etching process in a later step. Accordingly, during molding of the resin, resin of a thickness of several tens of nanometers or less is sandwiched between the mold and the substrate. It is known that liquid interposed in a microscopic gap of this order undergoes structuration and has high viscoelastic properties.

If the mold and the substrate are moved relative to one another for alignment while the mold and the resin on the substrate are in contact (while the resin is sandwiched between the mold and the substrate), a force corresponding to the viscoelasticity of the resin is applied to the mold and the substrate in a shearing direction (direction parallel to contact surface). Also, if a foreign particle is sandwiched between the mold and the substrate, the mold and the substrate will become engaged due to the foreign particle, and as described above, a force in the shearing direction will be applied to the mold and the substrate.

Due to the force in the shearing direction, a shearing force is generated in the mold or the substrate, which causes deformation. Accordingly, a relative shape difference between the mold side pattern and the substrate side pattern will occur. In other words, if a shearing force is generated in the mold or the substrate during alignment of the mold and the substrate, the shape of the mold side pattern and the shape of the substrate side pattern will change relative to each other and the overlay precision between the mold side pattern and the substrate side pattern will decrease.

SUMMARY OF THE INVENTION

The present invention provides, for example, an imprint apparatus advantageous in terms of overlay precision.

According to one aspect of the present invention, there is provided an imprint apparatus which performs an imprint process of molding an imprint material on a substrate with a mold and forming a pattern on the substrate, the apparatus including a detector configured to detect a shearing force generated in at least one of the mold and the substrate in a case where a pattern of the mold and a region of the substrate are aligned with each other with the imprint material on the substrate and the mold being in contact with each other, and a controller configured to control the imprint process based on the detected shearing force.

Further aspects of the present invention will become apparent from the following description of exemplary embodiments with reference to the attached drawings.

BRIEF DESCRIPTION OF THE DRAWINGS

FIGS. 4A to 4C are diagrams for describing update of supply amount information set as information indicating a supply amount of resin that is to be supplied onto a substrate.

DESCRIPTION OF THE EMBODIMENTS

Figure 1:
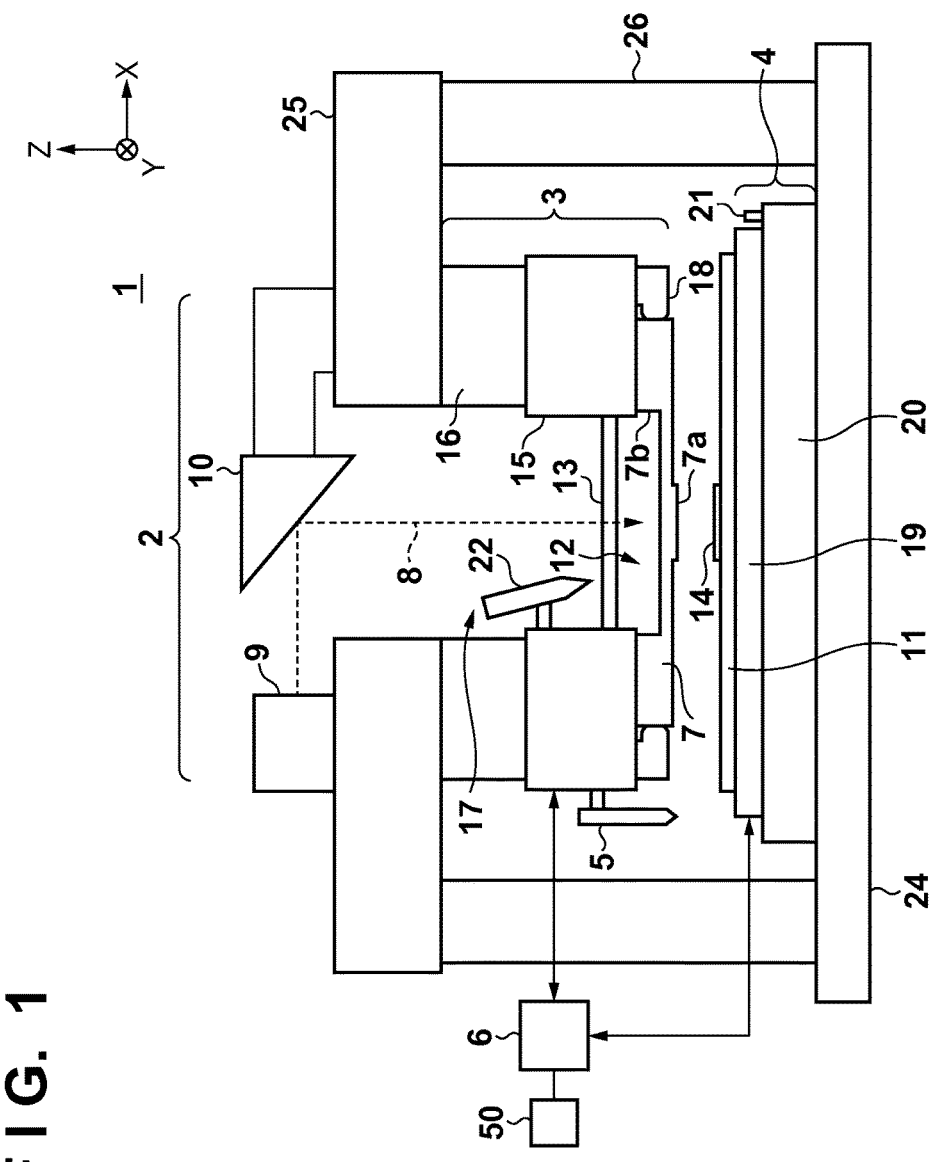
FIG. 1 is a schematic diagram showing a configuration of an imprint apparatus according to an aspect of the invention.

Preferred embodiments of the present invention will be described below with reference to the accompanying drawings. Note that the same reference numerals denote the same members throughout the drawings, and a repetitive description thereof will not be given.

FIG. 1 is a schematic diagram showing a configuration of an imprint apparatus according to an aspect of the invention. The imprint apparatus 1 is a lithography apparatus used in manufacturing a device such as a semiconductor device serving as an article. The imprint apparatus 1 performs imprint process of molding an imprint material (uncured resin) on a substrate using a mold and forming a pattern on the substrate. The imprint apparatus 1 uses photocuring in the present embodiment. Hereinafter, the Z axis is the direction parallel to the optical axis of an irradiation system that irradiates ultraviolet rays to the resin on the substrate, and the X axis and the Y axis are two directions that are perpendicular to each other in a plane that is orthogonal to the Z axis.

As shown in FIG. 1, an imprint apparatus 1 includes an irradiation unit 2, a mold holding mechanism (mold stage) 3, a substrate stage 4, a resin supply unit 5, a control unit 6, a magnification correction mechanism 18, an alignment measuring system 22, and a detection unit 50. Also, the imprint apparatus 1 includes a base surface plate 24 on which the substrate stage 4 is installed, a bridge surface plate 25 that fixes the mold holding mechanism 3, and a support pillar 26 that extends from the base surface plate 24 and supports the bridge surface plate 25. Furthermore, the imprint apparatus 1 includes a mold conveying mechanism that conveys a mold 7 from the exterior to the imprint apparatus 1 (mold holding mechanism 3), and a substrate conveying mechanism that conveys a substrate 11 from the exterior to the imprint apparatus 1 (substrate stage 4).

In the imprint process, the irradiation unit 2 irradiates ultraviolet rays (i.e., light for curing the resin 14) 8 to the resin 14 on the substrate 11 via the mold 7. The irradiation unit 2 includes a light source 9 and an optical element 10 for adjusting the ultraviolet rays 8 from the light source 9 so as to be light that is appropriate for imprint process. Since photocuring is used in the present embodiment, the imprint apparatus 1 includes the irradiation unit 2. Note that in the case of using heat curing, the imprint apparatus 1 has a heat source for curing the resin (heat curable resin) instead of the irradiation unit 2.

The mold 7 has a shape with a rectangular external circumference and includes a pattern (an unevenness pattern that is to be transferred to the substrate 11, such as a circuit pattern) 7a that is formed in a three-dimensional shape on the surface (pattern surface) opposing the substrate 11. The mold 7 is constituted by a material capable of transmitting the ultraviolet rays 8, such as quartz.

On a surface (light incident surface on which the ultraviolet rays 8 are incident) opposite to the pattern surface, the mold 7 includes a cavity (recessed portion) 7b for facilitating deformation of the mold 7. The cavity 7b has a circular planar shape. The thickness (depth) of the cavity 7b is set according to the size and material of the mold 7.

The cavity 7b is continuous with an opening 17 provided in the mold holding mechanism 3, and a light transmitting member 13 for sealing a space 12 surrounded by a portion of the opening 17 and the cavity 7b is provided in the opening 17. Pressure in the space 12 is controlled by a pressure adjustment mechanism (not shown). For example, when the mold 7 is pressed onto the resin 14 on the substrate 11, the pressure adjustment mechanism is used to increase the pressure in the space 12 so that it is greater than the external pressure, whereby the pattern 7a of the mold 7 is bent into a projecting shape with respect to the substrate 11. Accordingly, since the mold 7 is in contact with the resin 14 on the substrate 11 from the central portion of the pattern 7a, a case in which a gas (air) is trapped between the pattern 7a and the resin 14 can be suppressed, and the pattern 7a can be efficiently filled with the resin 14.

The mold holding mechanism (holding unit) 3 includes a mold chuck 15 that uses a vacuum suction force or an electrostatic force to pull and hold the mold 7, and a mold movement mechanism 16 that holds the mold chuck 15 and moves the mold 7 (mold chuck 15). The opening 17 is included in the central portion (inside) of the mold chuck 15 and the mold movement mechanism 16 so that the ultraviolet rays 8 from the irradiation unit 2 are irradiated to the resin 14 on the substrate 11.

The magnification correction mechanism (deforming mechanism) 18 corrects the shape of the pattern 7a of the mold 7 (i.e., deform the pattern 7a) by applying a force (displacement) to the side surface of the mold 7 that is arranged on the mold chuck 15 and held to the mold chuck 15. The magnification correction mechanism 18 includes a piezoelectric element that expands and contracts due to volume change when a voltage is applied thereto, and is configured to apply pressure to multiple locations on the side surfaces of the mold 7. By causing the pattern 7a of the mold 7 to deform, the magnification correction mechanism 18 aligns the shape of the pattern 7a of the mold 7 with the shape of the pattern (shot region of the substrate 11) formed on the substrate 11.

Note that a case is also conceivable in which it is difficult for the magnification correction mechanism 18 to align the shapes of the pattern 7a of the mold 7 with the shapes of the pattern formed on the substrate 11. In such a case, the shape of the pattern 7a on the mold 7 and the shape of the pattern formed on the substrate 11 may be brought closer together (shape difference is reduced) by causing the pattern formed on the substrate 11 to deform as well. In order to cause the pattern formed on the substrate 11 to deform, it is sufficient that the substrate 11 is heated and caused to deform thermally, for example.

The mold moving mechanism 16 moves the mold 7 in the Z-axis direction so as to selectively press the mold 7 onto the resin 14 on the substrate 11 (stamping) or remove of the mold 7 from the resin 14 on the substrate 11 (mold removal). A linear motor and an air cylinder are examples of actuators that can be applied to the mold moving mechanism 16. The mold moving mechanism 16 may be constituted by multiple driving systems such as a rough driving system and a fine driving system, in order to position the mold 7 at a high precision. Also, the mold moving mechanism 16 may be configured to be able to move the mold 7 not only in the Z axis direction, but also in the X and Y axis directions. Furthermore, the mold moving mechanism 16 may be configured to have a tilt function for adjusting the position in the θ direction (direction of rotation about the Z axis) of the mold 7 or the inclination of the mold 7.

Stamping and removal of the mold 7 in the imprint apparatus 1 may be realized by moving the mold 7 in the Z axis direction as in the present embodiment, and it may be realized by moving the substrate 11 (substrate stage 4) in the Z axis direction. Also, stamping and removal of the mold 7 may be realized by moving both the mold 7 and the substrate 11 relative to each other in the Z axis direction.

A monocrystalline silicon substrate and an SOI (Silicon on Insulator) substrate are examples of the substrate 11. The resin 14 that is to be molded using the pattern 7a of the mold 7 is supplied (applied) onto the substrate 11.

The substrate stage 4 can move while holding the substrate 11. When the mold 7 is to be pressed onto the resin 14 on the substrate 11, alignment between the mold 7 and the substrate 11 is performed by moving the substrate stage 4. The substrate stage 4 includes a substrate chuck 19 that uses a vacuum suction force or an electrostatic force to pull and hold the substrate 11, and a substrate moving mechanism (driving unit) 20 that mechanically holds the substrate chuck 19 and can move in an XY plane. Also, a reference mark 21 that is used when positioning the substrate stage 4 is arranged on the substrate stage 4.

A linear motor and an air cylinder are examples of actuators that can be applied to the substrate moving mechanism 20. The substrate moving mechanism 20 may be constituted by multiple driving systems such as a rough driving system and a fine driving system, in order to position the substrate 11 at a high precision. Also, the substrate moving mechanism 20 may be configured to be able to move the substrate 11 not only in the X axis direction and the Y axis direction, but also in the Z axis direction. Furthermore, the substrate moving mechanism 20 may be configured to have a tilt function for adjusting the position in the θ direction (direction of rotation about the Z axis) of the substrate 11 and the inclination of the substrate 11.

The resin supply unit 5 supplies the resin 14 onto the substrate 11 based on supply amount information that has been set as information indicating the supply amount of the resin 14 that is to be supplied onto the substrate 11. In the present embodiment, the resin 14 is ultraviolet-curable resin having a property of curing due to the ultraviolet rays 8 being irradiated thereto. The resin 14 is selected according to various conditions of the step of manufacturing the semiconductor device, or the like. Also, the supply amount of the resin 14 that is supplied from the resin supply unit 5 (i.e., supply amount information) is set according to the thickness of the pattern of the resin 14 (thickness of the residual layer) formed on the substrate 11, the density of the pattern of the resin 14, and the like, for example.

The control unit 6 is constituted by a computer including a CPU, a memory, and the like, and performs overall control of the imprint apparatus 1 in accordance with a program stored in the memory. The control unit 6 controls imprint process in which a pattern is formed on the substrate by controlling the operation, adjustment, and the like of the units in the imprint apparatus 1. The control unit 6 may be constituted integrally with other portions of the imprint apparatus 1 (in a common housing), and it may be constituted separately from other portions of the imprint apparatus 1 (in a separate housing).

The alignment measuring system 22 measures position misalignment in the X and Y axis directions between the alignment mark formed on the substrate 11 and the alignment mark formed on the mold 7. Based on the position misalignment measured by the alignment measuring system 22, the control unit 6 adjusts the position of the substrate stage 4 (moves the substrate stage 4) such that the position of the mold 7 and the position of the substrate 11 are mutually aligned. Also, the alignment measuring system 22 can also measure the shape of the pattern 7a of the mold 7 and the shape of the pattern formed on the substrate 11. Accordingly, the alignment measuring system 22 functions also as a measurement unit configured to measure an alignment state between a region of the substrate 11 that is targeted to imprint process and the pattern 7a of the mold 7. In the present embodiment, the alignment measuring system 22 measures the shape difference between the pattern 7a of the mold 7 and the pattern formed on the substrate 11 (shot region).

The detection unit 50 detects a shearing force generated in at least one of the mold 7 and the substrate 11 in the case where the position of the mold 7 and the position of the substrate 11 are to be mutually aligned while the mold 7 and the resin 14 on the substrate 11 are in contact. The shearing force is a force in a direction parallel to the surface of contact between the mold 7 and the resin 14 (shearing direction).

Imprint process of the imprint apparatus 1 will be described below. First, after being conveyed by the substrate conveying mechanism, the substrate 11 is held (fixed) to the substrate stage 4 (substrate chuck 19), and the substrate stage 4 is moved so that the substrate 11 is located below the resin supply unit 5 (at the resin supply position). Also, the resin 14 is supplied (applied) to the predetermined shot region (imprint region) of the substrate 11 by the resin supply unit 5 (application step).

Next, after the resin 14 has been applied to the substrate 11, the substrate stage 4 is moved so that the substrate 11 (the predetermined shot region) is located below the mold 7. Then, the mold 7 is moved in the direction toward the substrate 11 by the mold moving mechanism 16 so that the mold 7 is pressed onto the resin 14 on the substrate 11 (stamping step). Accordingly, the mold 7 and the resin 14 on the substrate 11 are brought into contact and the pattern 7a of the mold 7 is filled with the resin 14.

Subsequently, in a state in which the mold 7 and the resin 14 on the substrate 11 are in contact, the ultraviolet rays 8 from the irradiation unit 2 are irradiated to the resin 14 via the mold 7, thus curing the resin 14 on the substrate 11 (curing step).

Next, the mold moving mechanism 16 moves the mold 7 in the direction of moving away from the substrate 11 so as to remove the mold 7 from the cured resin 14 on the substrate 11 (mold removing step). Accordingly, the pattern (layer) of the resin 14 with a three-dimensional shape corresponding to the pattern 7a of the mold 7 is formed in the shot region of the substrate 11.

By repeating these steps (imprint process) while changing the shot region by moving the substrate stage 4, the pattern of the resin 14 can be formed on the entire surface of substrate 11, or in other words, in all shot regions of the substrate 11.

Figure 2:
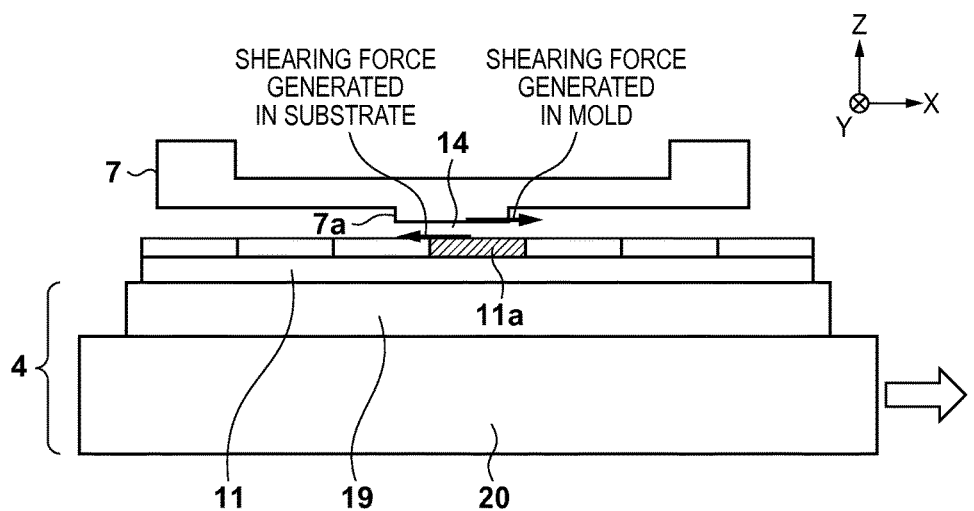
FIG. 2 is a diagram for describing a shearing force generated in a mold or a substrate in the imprint apparatus shown in FIG. 1.

Here, in the imprint process, a case will be considered in which the position of the mold 7 and the position of the substrate 11 are mutually aligned after the stamping step, or in other words, in a state in which the mold 7 and the resin 14 on the substrate 11 are in contact (the relative positions of the mold 7 and the substrate 11 are aligned). In such a case, as shown in FIG. 2, there is a possibility that a force in a direction parallel to the contact surface of the mold 7 and the resin 14 (shearing force) will be generated in the mold 7 or the substrate 11. For example, after the stamping step, if the thickness of the resin 14 that is sandwiched between the mold 7 and the substrate 11 decreases to less than a certain value, the resin 14 will show a high viscoelasticity due to molecules in the compound undergoing structuration. The structuration of the resin 14 differs depending on the molecular size and molecular structure of the included components, but generally, it occurs at a thickness of several tens of nanometers or less. For example, even if the resin supply unit 5 controls the supply amount of the resin 14 that is to be supplied to the substrate 11, there are cases where the thickness of the resin 14 after the stamping step is less than or equal to the thickness at which structuration occurs, due to slight surface roughness of the mold 7 or the substrate 11.

With reference to FIG. 2, a case will be considered in which the substrate stage 4 is moved in a +X direction. In this case, the pattern 11a formed on the substrate 11 receives a shearing force in a −X direction at the surface of contact with the structurated resin 14 due to elastic deformation of the structurated resin 14. Similarly, the pattern 7a of the mold 7 receives a shearing force in the +X direction at the surface of contact with the structurated resin 14. Accordingly, since the pattern (shot region) 11a on the substrate 11 and the pattern 7a of the mold 7 deform, the shape difference between the pattern 11a and the pattern 7a increases. For this reason, even if the magnification correction mechanism 18 is used, the shape difference between the pattern 11a and the pattern 7a cannot be sufficiently reduced, and the overlay precision decreases.

Figure 3:
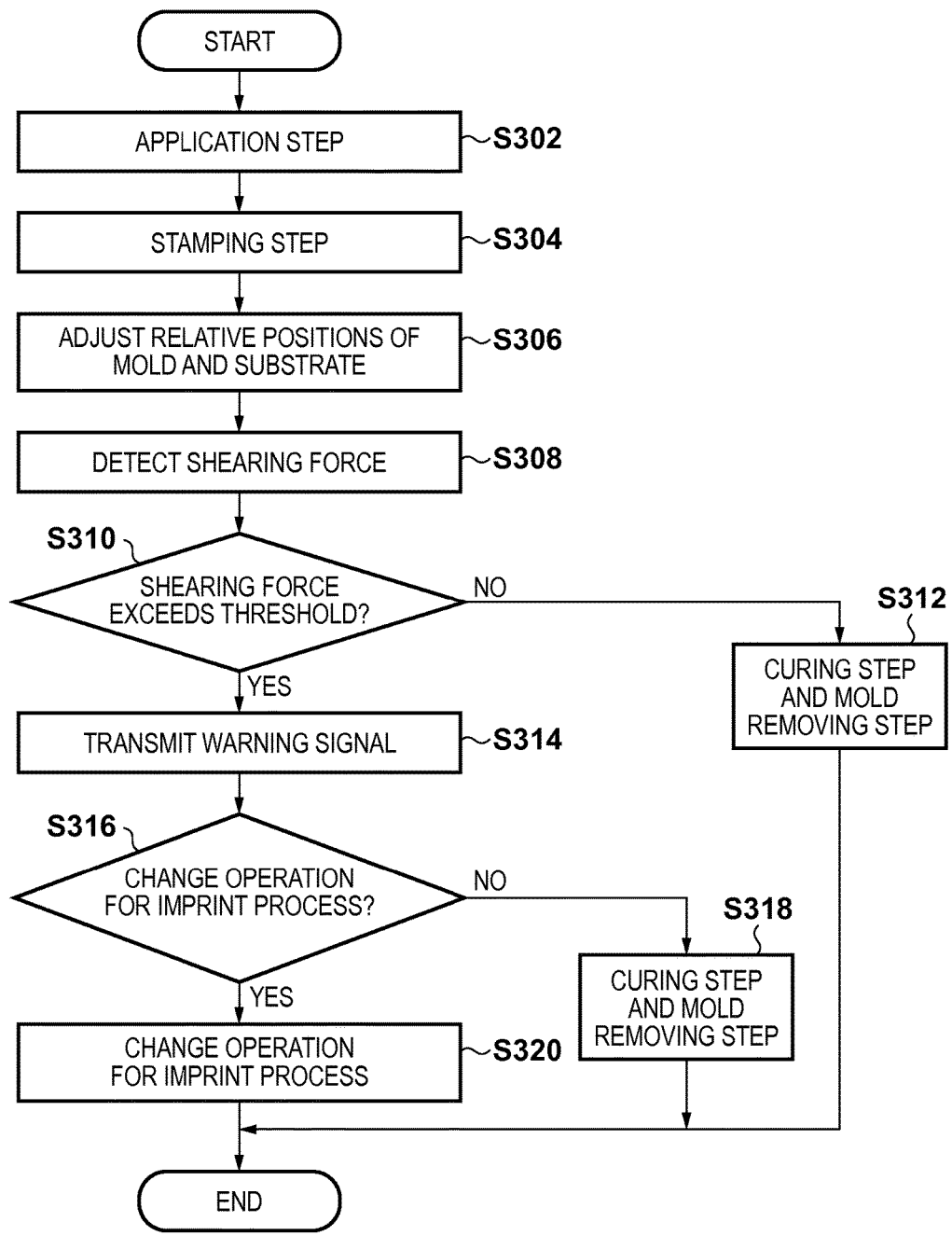
FIG. 3 is a flowchart for describing imprint process in the imprint apparatus shown in FIG. 1.

In view of this, with the imprint apparatus 1 of the present embodiment, as shown in FIG. 3, imprint process is controlled based on the shearing force generated in the mold 7 or the substrate 11. In step S302, as described above, the application step is performed in which the resin 14 is supplied onto the substrate 11. In step S304, as described above, the stamping step is performed in which the mold 7 is pressed onto the resin 14 on the substrate 11.

In step S306, in a state in which the mold 7 and the resin 14 on the substrate 11 are in contact, the substrate stage 4 (substrate 11) is moved in the XY plane direction (i.e., the relative position between the mold 7 and the substrate 11 is adjusted) in order to cause the position of the mold 7 and the position of the substrate 11 to be mutually aligned.

In step S308, a shearing force generated in the mold 7 or the substrate 11 is detected in the case where the position of the mold 7 and the position of the substrate 11 are to be mutually aligned while the mold 7 and the resin 14 on the substrate 11 are in contact (according to step S306).

For example, the detection unit 50 can specify the shearing force by detecting the force (thrust) applied to the substrate stage 4 when the substrate stage 4 is moved so as to change the relative positions of the mold 7 and the substrate 11. The force applied to the substrate stage 4 can be obtained using a current value supplied to the linear motor that is applied as the actuator of the substrate moving mechanism 20. Accordingly, the detection unit 50 can detect the shearing force based on the current value supplied to the linear motor that is applied as the actuator of the substrate moving mechanism 20.

Similarly, the detection unit 50 can specify the shearing force by detecting the force applied to the mold holding mechanism 3 when the mold holding mechanism 3 is moved so as to change the relative positions of the mold 7 and the substrate 11. The force applied to the mold holding mechanism 3 can be obtained using a current value supplied to the linear motor that is applied as the actuator of the mold moving mechanism 16.

Also, after the stamping step, when the magnification correction mechanism 18 causes the pattern 7a of the mold 7 to deform, the detection unit 50 can specify the shearing force by detecting the force (reactive force) received from the mold 7 by the magnification correction mechanism 18. In other words, after the relative positions of the mold 7 and the substrate 11 are changed while the mold 7 and the resin 14 are in contact, the shearing force can be specified by detecting the force applied to the mold 7 by the magnification correction mechanism 18 in order to cause the pattern 7b of the mold 7 to deform. The force received from the mold 7 by the magnification correction mechanism 18 can be obtained using the current value supplied to the piezoelectric element constituting the magnification correction mechanism 18.

In step S310, it is determined whether or not the shearing force detected in step S308 (the shearing force generated in the mold 7 or the substrate 11) exceeds a threshold. The determination is performed by the control unit 6. If the shearing force detected in step S308 does not exceed the threshold (the shearing force is less than the threshold), the procedure moves to step S312. On the other hand, if the shearing force detected in step S308 exceeds the threshold, the procedure moves to step S314.

In step S312, as described above, the curing step is performed in which the resin 14 on the substrate 11 is cured with the irradiation of the ultraviolet rays 8, and the mold removing step is performed in which the mold 7 is removed from the cured resin 14 on the substrate 11. Thus, if the shearing force generated in the mold 7 or the substrate 11 does not exceed the threshold, normal pattern formation is performed. Normal pattern formation means repeatedly performing imprint process, which includes the application step, the stamping step, the curing step, and the mold removal step.

In step S314, a warning signal indicating that the shearing force generated in the mold 7 or the substrate 11 exceeds the threshold is transmitted. The warning signal is generated by the control unit 6, and, for example, is transmitted from the control unit 6 to a monitor, and via the monitor, a user is notified of the fact that the shearing force generated in the mold 7 or the substrate 11 exceeds the threshold.

In step S316, based on the shearing force detected in step S308, it is determined whether or not an operation for imprint process is to be changed. The determination is performed by the control unit 6. If an operation for imprint process is not to be changed, the procedure transitions to step S318. On the other hand, if an operation for imprint process is to be changed, the procedure transitions to step S320.

In step S318, as described above, the curing step is performed in which the resin 14 on the substrate 11 is cured with the irradiation of the ultraviolet rays 8, and the mold removing step is performed in which the mold 7 is removed from the cured resin 14 on the substrate 11. Note that the curing step and the mold removal step in step S318 are performed in a state in which a shearing force exceeding the threshold has been generated in the mold 7 or the substrate 11 (in the warning state), unlike the curing step and the mold removal step in step S316. Here, the pattern formed on the substrate 11 via step S318 is processed as a faulty pattern, for example, and the relationship between the result of overlaying and the shearing force is reflected in a subsequent shot region (a shot region that is to be targeted to imprint process in the future).

In step S320, an operation for imprint process is changed. For example, for the change in an operation for imprint process, the application step is changed. In the present embodiment, as shown in FIGS. 4A to 4C, the supply amount information set as the information indicating the supply amount of the resin 14 that is to be supplied onto the substrate 11 is updated based on the shearing force detected in step S308. Specifically, after the stamping step, the shape difference between the pattern 7a of the mold 7 and the pattern 11a on the substrate 11 from when the relative positions of the mold 7 and the substrate 11 were changed is measured by the alignment measuring system 22. As shown in FIG. 4A, if the substrate stage 4 (substrate 11) has moved in the +X direction, a shearing force is generated in the −X direction (direction of arrow) in the pattern 11a on the substrate 11. Thus, when a shearing force in the −X direction is generated in the substrate 11, only a portion of the pattern 11a on the substrate 11 is deformed in the −X direction. Accordingly, as shown in FIG. 4B, based on the shape difference measured by the alignment measuring system 22, it is possible to estimate (specify) locations at which the shearing force has been generated in the shot region of the substrate 11 (locations indicated by oblique lines). Estimation of the locations at which the shearing force has been generated in the shot region of the substrate 11 is performed by the control unit 6, for example (i.e., the control unit 6 estimates the locations at which the shearing force has been generated in the shot region of the substrate 11). First, for each of multiple regions DR obtained by dividing the shot region (pattern 11a) of the substrate 11 in a grid shape, the amount of deformation of the pattern 11a from when the substrate 11 was moved in the X axis direction and the Y axis direction while the mold 7 and the resin 14 were in contact is acquired in advance as numeric value data. Then, by comparing the deformation amount of the pattern 11a on the substrate 11 that was measured by the alignment measuring system 22 and the numeric value data that was acquired in advance, locations in which the shearing force was generated (locations in which the resin 14 underwent structuration) are estimated from the multiple regions DR. Partial generation of the shearing force in the pattern 11a on the substrate 11 is caused by the thickness of the resin 14 after the stamping step being less than or equal to the thickness that causes structuration in locations in which it was estimated that the shearing force was generated. In view of this, in the application step of the imprint process for a subsequent shot region, as shown in FIG. 4C, it is possible to suppress structuration of the resin 14 (i.e., generation of a shearing force) by increasing the supply amount of the resin 14 that is supplied to the location in which the shearing force has been generated. Thus, the set supply amount information is updated so that the supply amount of the resin 14 that is to be supplied to locations in which it has been estimated that the shearing force has been generated is increased. In other words, a location is estimated in which the shearing force falls outside of a tolerance with respect to at least one of the mold 7 and the substrate 11, and the supply amount of the resin 14 that is to be supplied to the location (to the region on the substrate corresponding to the location) is set.

Also, for the change in an operation for the imprint process, it is possible to change (control) the velocity of relative movement for alignment between the mold 7 and the substrate 11 while the mold 7 and the resin 14 on the substrate 11 are in contact, and, in the present embodiment, the movement velocity of the substrate stage 4. If the structurated resin 14 has a high viscoelasticity, the mold 7 and the substrate 11 receive a higher viscoelastic resistance the faster the velocity of relative moment between the mold 7 and the substrate 11 is. Accordingly, by slowing down the relative velocity of the mold 7 and the substrate 11, the shearing force corresponding to the viscoelastic resistance can be reduced. Thus, the velocity of relative movement for alignment between the mold 7 and the substrate 11 while the mold 7 and the resin 14 on the substrate 11 are in contact is controlled such that the shearing force generated in the mold 7 and the substrate 11 is less than or equal to the threshold.

Also, for the change in an operation for the imprint process, it is possible to stop the imprint process. When the relative positions of the mold 7 and the substrate 11 are changed after the stamping step, generation of a shearing force exceeding the threshold in the mold 7 or the substrate 11 causes damage to the mold 7 or the substrate 11. Accordingly, if a shearing force exceeding the threshold is detected, damage to the mold 7 or the substrate 11 can be prevented by stopping imprint process.

If imprint process is stopped, it is preferable that the mold 7 is exchanged for a new mold. In addition to structuration of the resin 14, foreign particles such as particles in the apparatus are also considered to cause generation of a shearing force in the mold 7 or the substrate 11. In the stamping step, upon sandwiching a foreign particle between the mold 7 and the substrate 11, the mold 7 and substrate 11 become engaged due to the foreign particle, and a shearing force is generated in the mold 7 or the substrate 11. Accordingly, if a shearing force according to which the mold 7 will be damaged (a shearing force exceeding the threshold value) is detected, a defect in the pattern formed on the substrate 11 can be prevented by exchanging the mold 7 for a new mold. Note that in the case of exchange for a new mold, it is preferable that the mold 7 that was used until the current time is washed. By washing the mold 7 so as to remove foreign particles, generation of a shearing force caused by a foreign particle attached to the mold 7 can be prevented when the mold 7 is re-used.

Thus, by changing an operation for imprint process in step S320, it is possible to suppress a case in which a shearing force exceeding a threshold is generated in the mold 7 or the substrate 11 in the imprint process with respect to the next shot region of the substrate 11 or the next substrate. Note that regarding the change in an operation for imprint process, rather than being limited to separately performing the processes of changing the supply amount of the resin 14, controlling the velocity of relative movement for alignment between the mold 7 and the substrate 11, and stopping the imprint process, these processes may be performed simultaneously.

Also, in step S316, it is possible to determine whether or not an operation for imprint process is to be changed with consideration given to a shearing force detected when performing imprint process on a shot region in the past (shearing force record) in addition to the shearing force detected in step S308. In other words, information regarding a shearing force detected by the detection unit 50 and information regarding the corresponding result of imprint process are stored in the memory (storage) of the control unit 6. Then, based on the shearing force detected in step S308 and the information stored in the memory of the control unit 6, it is determined whether or not an operation for imprint process is to be changed. Accordingly, determination can be performed with consideration given to the relationship between the shearing force detected by the detection unit 50 and the faulty pattern generation rate. Also, a reference for determining whether or not an operation for imprint process is to be changed may be set each time an operation for imprint process is changed.

According to the imprint apparatus 1 of the present embodiment, the influence of a shearing force generated in the mold 7 or the substrate 11 can be reduced, and the overlay precision of the mold 7 and the substrate 11 can be improved. Accordingly, the imprint apparatus 1 can provide a high-grade article such as a semiconductor device with a high throughput and with economic efficiency.

Also, detection of the shearing force by the detection unit 50 can also be performed in advance using a dummy substrate. Specifically, a dummy substrate configured to be the same size and constituted by the same material as the substrate 11 is used while imprint process is performed as described above, and a shearing force generated in the mold 7 or the dummy substrate is detected by the detection unit 50. Then, based on the shearing force detected by the detection unit 50, an operation for the imprint process is changed. Accordingly, imprint process with consideration given to a shearing force generated in the mold 7 or the substrate 11 can be performed on the actual substrate 11. Also, in the case of performing imprint process on multiple substrates 11, imprint process of a subsequent substrate may be performed with consideration given to a shearing force detected when imprint process was performed on a previous substrate.

Also, in the present embodiment, imprint process is controlled based on the shearing force detected by the detection unit 50. Note that as shown in FIGS. 4A and 4B, the location in which the shearing force was generated in the shot region on the substrate 11 and the location in which deformation occurred in the shot region on the substrate 11 (deformation location) match. Accordingly, it is also possible to control imprint process based on the shape difference between the pattern 7a of the mold 7 and the pattern 11a on the substrate 11, measured by the alignment measuring system 22. Specifically, the deformation location in which the deformation was generated in the shot region of the substrate 11 is specified based on the shape difference between the pattern 7a of the mold 7 and the pattern 11a on the substrate 11, measured by the alignment measuring system 22. Also, it is sufficient that the supply amount information is updated so that the supply amount of the resin 14 that is to be supplied to the specified deformation location increases.

A method for manufacturing a device serving as an article (semiconductor device, magnetic storage medium, liquid crystal display element, etc.) will be described next. The manufacturing method includes a step of forming a pattern on a substrate (wafer, glass substrate, film-shaped substrate, etc.) using the imprint apparatus 1. The manufacturing method further includes a step of processing a substrate on which a pattern has been formed. The processing step can include a step of removing a residual layer for the pattern. Also, other publicly-known steps, such as a step of etching a substrate using the pattern as a mask, can be included. The article manufacturing method according to the present embodiment is advantageous in comparison to conventional methods in at least one of performance of the article, product quality, productivity, and production cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-001956 filed on Jan. 8, 2014, which is hereby incorporated by reference herein in its entirety.

What is claimed is:

1. An imprint apparatus which performs an imprint process of molding an imprint material on a substrate with a mold, the apparatus comprising:
    a detector configured to detect a shearing force generated in a case where (A) the mold and the substrate are aligned with each other, with the imprint material on the substrate and the mold being in contact with each other in an XY plane direction, and where (B) the mold moves on the Z axis which is orthogonal to the XY plane to contact the imprint material; and
    a controller configured to control the imprint process based on the detected shearing force.

2. The apparatus according to claim 1, further comprising:
    a stage configured to hold the substrate; and
    a driving device configured to move the stage,
    wherein the detector is configured to detect the shearing force based on thrust of the driving device.

3. The apparatus according to claim 1, further comprising:
    a holder configured to hold the mold,
    wherein the detector is configured to detect the shearing force based on a force applied to the holder.

4. The apparatus according to claim 1, further comprising:
    a deformation mechanism configured to apply a force to the mold to deform the mold,
    wherein the detector is configured to detect the shearing force based on the applied force.

5. The apparatus according to claim 1, further comprising:
    a supply device configured to supply the imprint material onto the substrate,
    wherein the controller is configured to control a supply amount of the imprint material by the supply device based on the detected shearing force.

6. The apparatus according to claim 5, further comprising:
    a measurement device configured to measure an alignment state between the pattern of the mold and the region of the substrate,
    wherein the controller is configured to estimate a region in which the shearing force is outside a tolerance with respect to at least one of the mold and the substrate based on the measured alignment state, and set a supply amount of the imprint material to be supplied to a region on the substrate corresponding to the estimated region.

7. The apparatus according to claim 1,
    wherein the controller is configured to control a velocity of relative movement for the alignment between the mold and the substrate based on the detected shearing force.

8. The apparatus according to claim 7,
    wherein the controller is configured to control the velocity of relative movement so that the detected shearing force is not greater than a threshold.

9. The apparatus according to claim 1,
    wherein the controller is configured to abort the imprint process if the detected shearing force exceeds a threshold.

10. The apparatus according to claim 1, further comprising:
    a storage configured to store information regarding the detected shearing force and information regarding the imprint process corresponding thereto,
    wherein the controller is configured to control the imprint process based on the detected shearing force and the stored information.

11. The apparatus according to claim 1, wherein the shearing force comprises a force generated in the XY plane when pressing the mold against the imprint material on the substrate along the Z axis direction.

12. The apparatus according to claim 1, wherein the XY plane is parallel to a surface of the substrate.

13. The apparatus according to claim 1, wherein the XY plane is parallel to a surface on which the pattern of the mold is formed.

14. An imprint apparatus which performs an imprint process of molding an imprint material on a substrate with a mold and forming a pattern of the imprint material on the substrate, the apparatus comprising:
  a measurement device configured to measure an alignment state between a pattern of the mold and a region of the substrate;
  a supply device configured to supply imprint material onto the substrate; and
  a controller configured to estimate a region in which a shearing force is outside a tolerance, based on the alignment state measured by the measurement device in a case where (A) the mold and the substrate are aligned with each other in an XY plane direction, with the imprint material on the substrate and the mold being in contact with each other, and where (B) the mold moves on the Z axis which is orthogonal to the XY plane to contact the imprint material, and set a supply amount of the imprint material to be supplied to a region on the substrate corresponding to the estimated region.

* * * * *